United States Patent [19]

Blankenship et al.

[11] Patent Number: 4,964,277

[45] Date of Patent: Oct. 23, 1990

[54] PLASTIC WATER BOX FOR A THERMOELECTRIC AIR CONDITIONER

[75] Inventors: William P. Blankenship, Carnegie; Robert Ritter, Pleasant Hills; Phillip F. Schmitten, N. Huntingdon, all of Pa.

[73] Assignee: Westinghouse Electric Corp., Pittsburgh, Pa.

[21] Appl. No.: 461,574

[22] Filed: Jan. 5, 1990

[51] Int. Cl.$^5$ ............................................. F25B 21/02
[52] U.S. Cl. ........................................ 62/3.2; 62/3.3; 62/238.2
[58] Field of Search ..................... 62/3.2, 3.3, 238.2; 361/385

[56] References Cited

U.S. PATENT DOCUMENTS 2,970,450  2/1961  Roeder, Jr. et al. ............... 62/238.2
3,246,477  4/1966  Gable et al. ........................ 62/3.3

Primary Examiner—Albert J. Makay
Assistant Examiner—John Sollecito
Attorney, Agent, or Firm—Fred J. Baehr, Jr.

[57] ABSTRACT

A thermoelectric air conditioner having a fiber reinforced plastic water box made of two identical halves, each of which has a serpentine groove with a plurality of openings that receive a first heat transfer plate and an array of semiconductors of both P and N type and a second heat transfer plate which is finned, the heat transfer plates bridge the semiconductors to form a single series for the whole assembly.

20 Claims, 4 Drawing Sheets

FIG. 5.
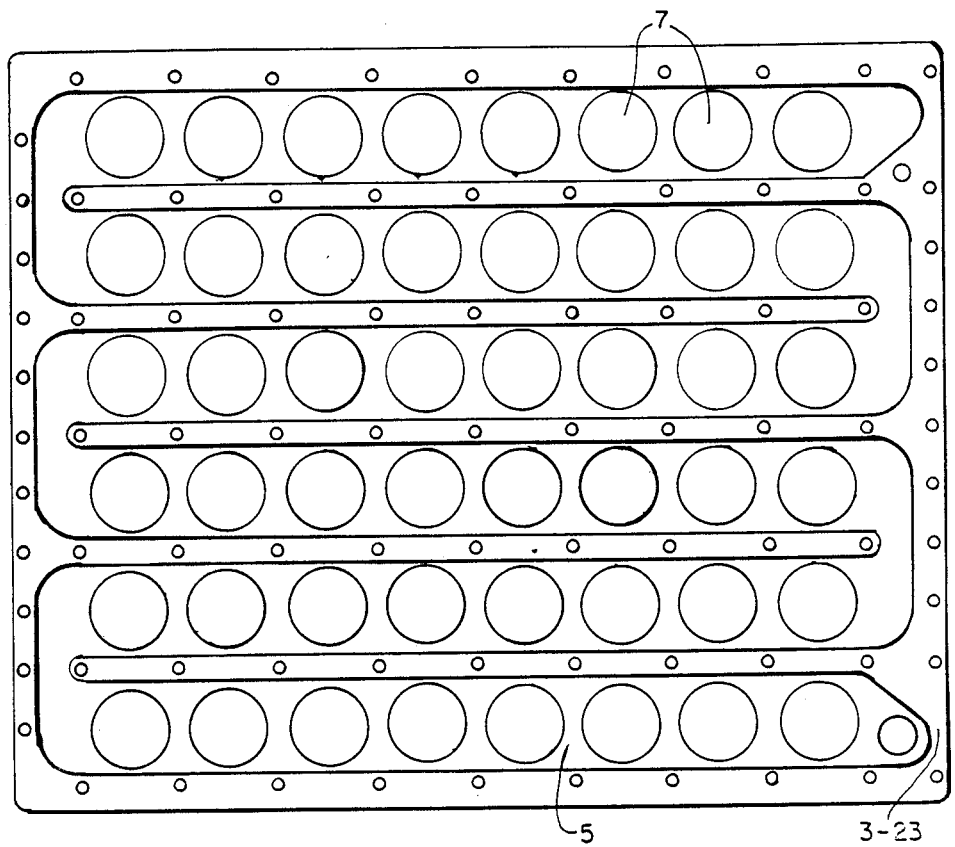
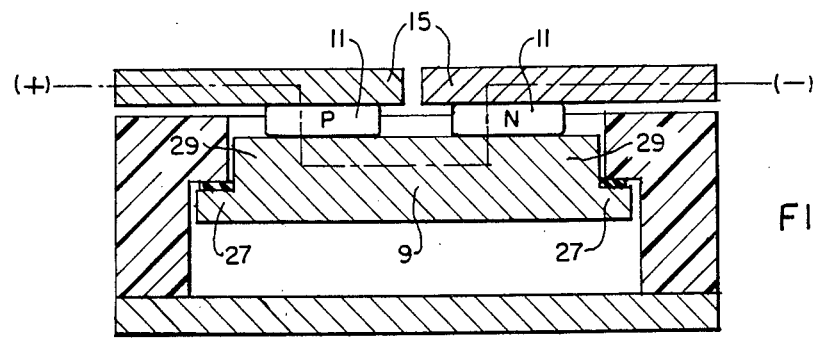
FIG. 6.

PLASTIC WATER BOX FOR A THERMOELECTRIC AIR CONDITIONER

BACKGROUND OF THE INVENTION

The invention relates to a thermoelectric air conditioner and more particularly to a plastic water box for the thermoelectric air conditioner.

Thermoelectric air conditioners are relatively small, quiet, shock resistant and have no moving parts, however they do require a large amount of energy as they are not efficient. They utilize a plurality of semiconductor arrays sandwiched between two conductive plates to transfer heat from one conductive plate to another and to pass the operating current in series through the conductive plates and the semiconductor arrays.

SUMMARY OF THE INVENTION

Among the objects of the invention may be noted the provision of an improved thermoelectric air conditioner which uses a plastic water box which improves efficiency, reduces the number of parts and the cost and provides electrical isolation between the conductive plates.

In general, a thermoelectric air conditioner having a plastic water box and a plurality of first and second heat transfer plates separated by an array of semiconductor pellets, when made in accordance with this invention, comprises a water box formed from a first fiber reinforced plastic plate having a groove disposed in one side thereof with a plurality of openings disposed in said groove for receiving the first heat transfer plates with an array of semiconductor pellets soldered thereto and a sealant disposed between the first plastic plate and first heat transfer plates adjacent the periphery of the openings. The second heat transfer plates are disposed on the side of the first plastic plate without the groove and in contact with the semiconductor pellets. A second fiber reinforced plastic plate cooperating with the first fiber reinforced plastic plate to form the water box which electrically and thermally isolates the first and second heat transfer plates and provides a closed channel for heat rejection fluid.

BRIEF DESCRIPTION OF THE DRAWINGS

The invention as set forth in the claims will become more apparent by reading the following detailed description in conjunction with the accompanying drawings, wherein like reference numerals refer to like parts through the drawings and in which:

FIG. 5 is a plan view of a portion of a water box;

FIG. 6 is a schematic view of a single array thermoelectric air conditioner.

DESCRIPTION OF THE PREFERRED EMBODIMENT

Figure 1:
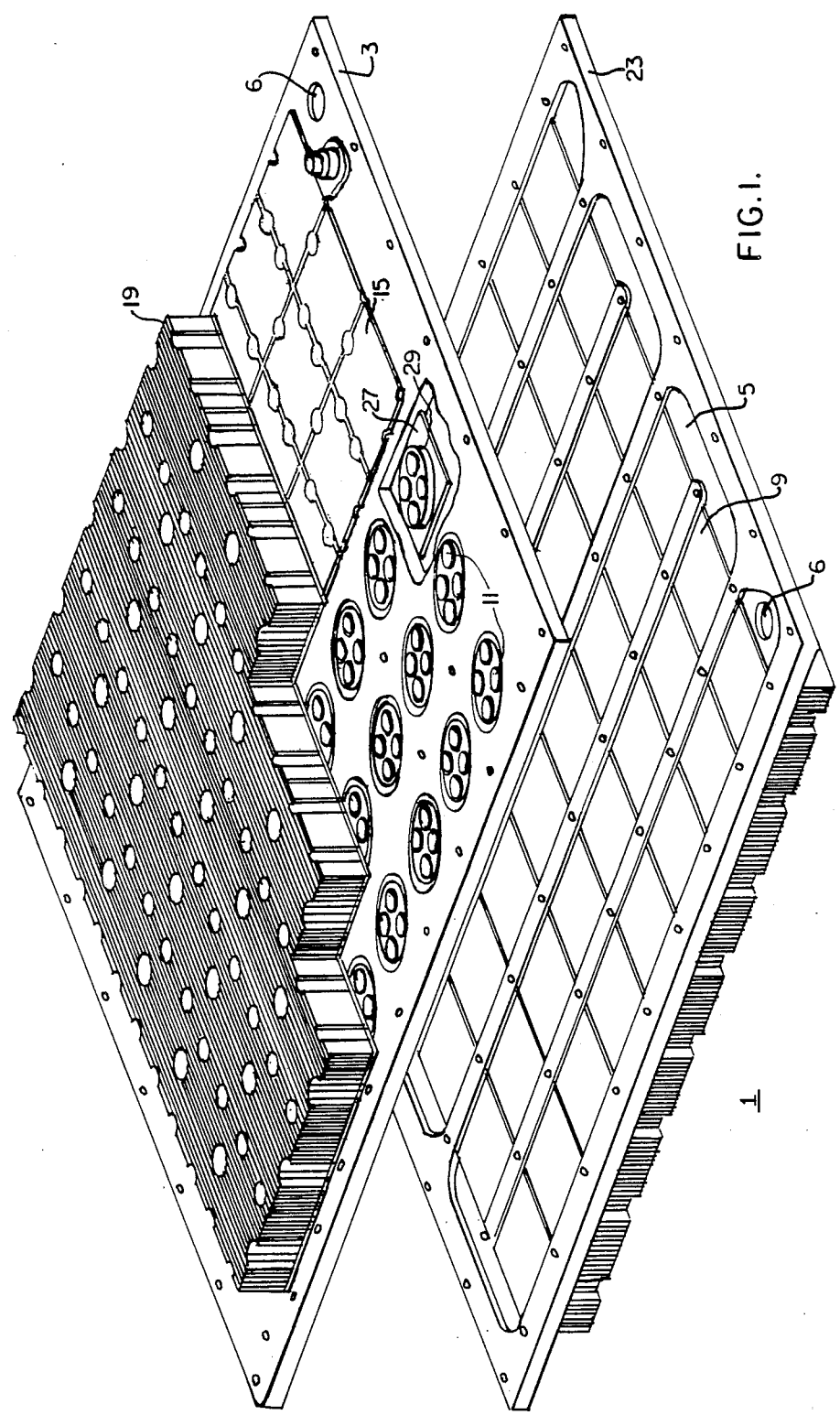
FIG. 1 is an exploded pictorial view of a thermoelectric air conditioner with portions removed.
Figure 2:
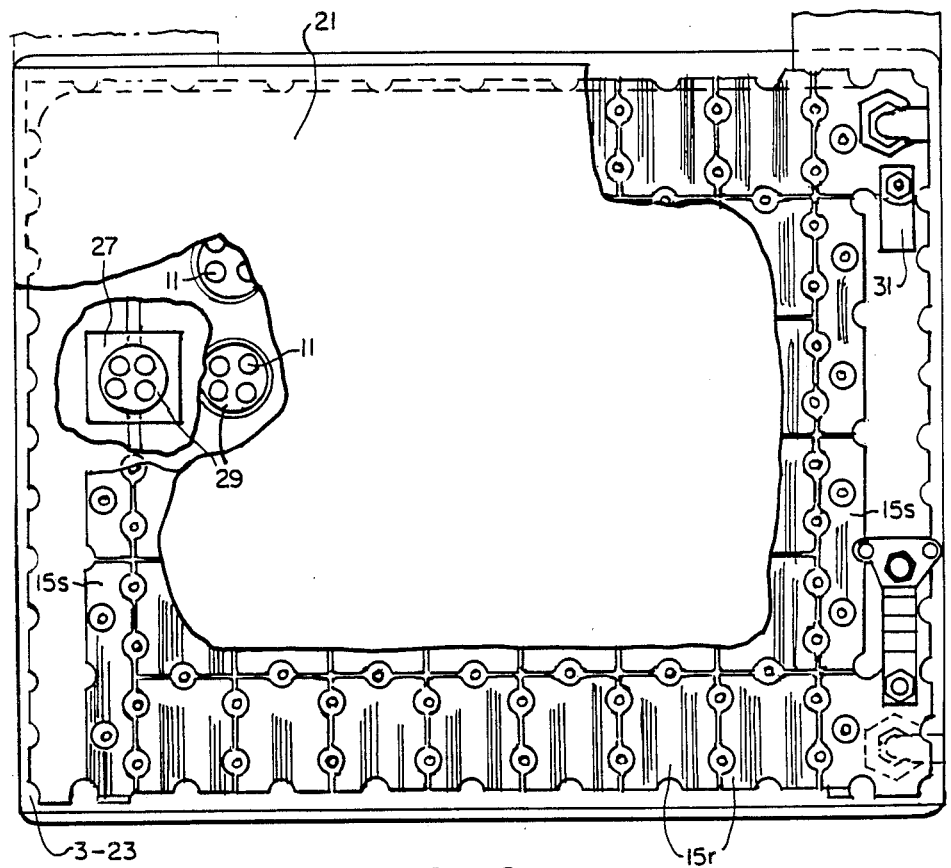
FIG. 2 is plan view of a thermoelectric air conditioner with portions removed.
Figure 3:
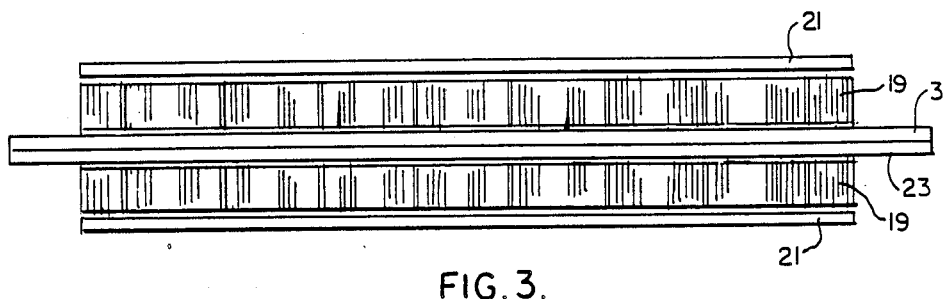
FIG. 3 is a sectional view taken on line III—III of FIG. 2.
Figure 4:
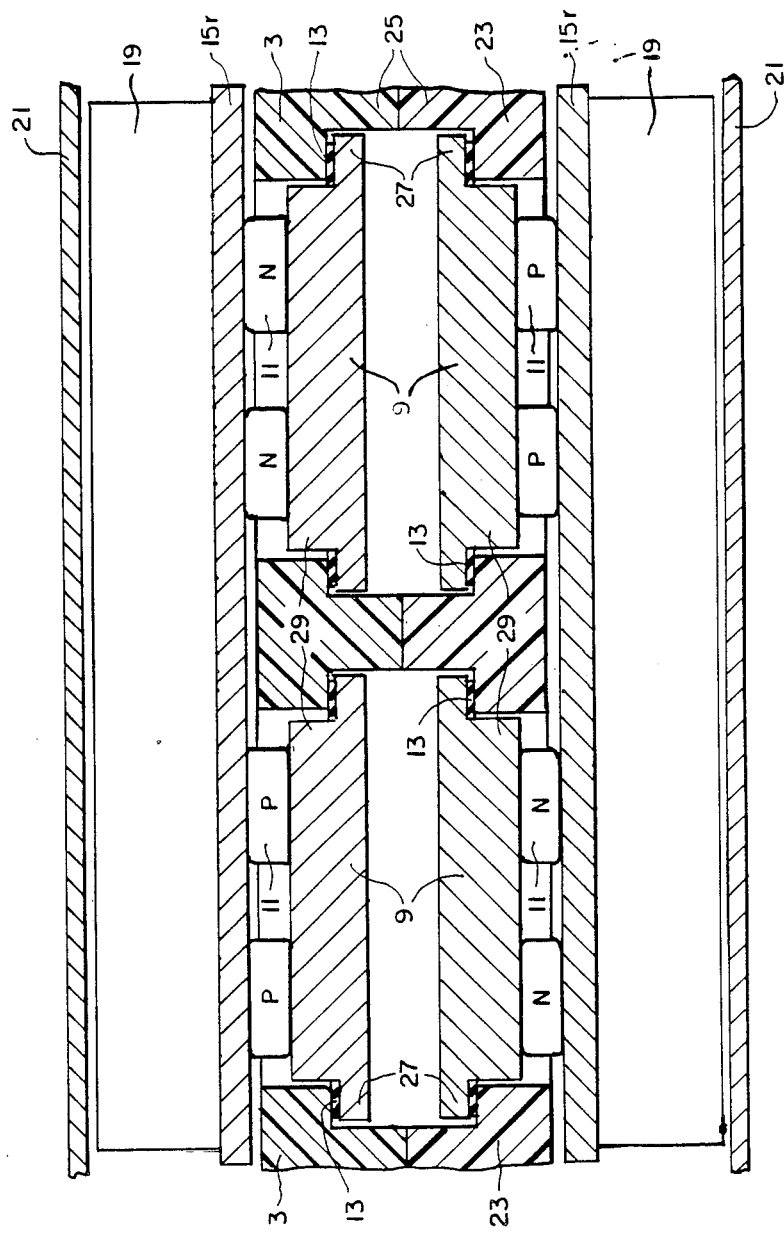
FIG. 4 is an enlarged partial sectional view taken on line IV—IV of FIG. 2.

Referring now to the drawings in detail and in particular to FIGS. 1 through 5 there is shown a thermoelectric air conditioner 1 comprising a first fiber reinforced plastic plate 3 made of a material such as polyphenylene sulfide, which has a coefficient of thermal expansion which approximately corresponds to that of aluminum and is an electrical and thermal insulator. The first fiber reinforced plastic plate 3, as shown in the drawings, has a single serpentine shaped groove 5 with parallel segments disposed within one surface thereof. Disposed within the groove 5 is a fluid port 6 and a plurality of openings 7. Disposed in the openings 7 are a plurality of first thermally and electrically conductive heat transfer plates 9 with an array of semiconductor pellets 11 soldered thereto. A sealant 13 is disposed between the first fiber reinforced plate 3 and the first heat transfer plates 9. A second heat transfer plate 15 is disposed in electrical contact with the semiconductor pellet array 11 on the side of the first fiber reinforced plate 3 not having the groove 5. The second heat transfer plate 15 has an extended surface or fins 19 for transferring or removing heat from the air. A cover plate 21 is disposed over the distal margins of the fins 19 to form an air passage or channel.

A second fiber reinforced plastic plate 23 is disposed to cooperate with the first reinforced plate 3 to form a heat rejection channel or water box 25. The second fiber reinforced plastic plate 23 is identical to the first fiber reinforced plastic plate with the same grove 5, fluid port 6 and openings 7 for receiving the first heat transfer plates 9 with the semiconductor array soldered thereto. The second heat transfer plates 15 are disposed in electrical contact with the semiconductor pellets 11.

The first heat transfer plates 9 have a square base 27 with a circular step 29, which extends from the base 27 and fits within the openings 7. The bases 27 are uniform in size and fit in the groove 5 with a space between adjacent bases 27.

The semiconductor pellets 11 are wafer shaped and are soldered to both the first and second heat transfer plates 9 and 15 to insure good electrical contact. The semiconductors 11 are disposed in a square array of four on each circular step 29 with two P and two N type semiconductors in each array disposed so that neither the two P nor the two N semiconductors are disposed on a diagonal line extending between the corners Of the base 27. The semiconductor are made of a material such as bismuth telluride and are doped with the proper material to make them either N or P type semiconductors.

The second heat transfer plates 15 are square 15s and rectangular 15r in shape. The square plates 15s are disposed to bridge the P and N semiconductors of first heat transfer plates 9 disposed in the adjacent parallel segments of the groove 5 and the rectangular plates 15r are disposed to bridge the end P and N semiconductors at the end of the parallel segments of the grooves 5 to form a series circuit in each half of the water box 25 and a bridging connection 31 at one corner of the water box 25, between the second heat transfer plates 15 forms a single series circuit for the whole assembly. To accomplish this the arrays in one parallel segment starting form one end of the assembly is arranged N-P throughout the segment and the adjacent segments starting from the same end the assembly are arrange P-N throughout, whereby the series circuit for the whole assembly is formed. The circuit operates at about 300 amps and 5 volts, making each assembly require about 1500 watts.

Referring now to FIG. 6 there is shown schematic view of a single semiconductor array with a P and N semiconductor and a dc current flowing therethrough to illustrate the operation of the thermoelectric air conditioner. The current flowing through the semiconductors removes heat from the second heat transfer plate 15 and transfers the heat to the first heat transfer plate 9. Air passes over the fins 19 and is cooled and water or other heat rejection fluid is passed through the water box 25 removing heat from the first heat transfer plates 9, the electric current passing thorough the semiconductors effectuate the heat transfer between the first and second heat transfer plates 9 and 15. The arrangement described above is a multiplicity of semiconductor arrays disposed in a fiber reinforced plastic water box 25.

The thermoelectric air conditioner 1 with a glass reinforced plastic water box 25 advantageously increases the cooling efficiency through reducing heat losses by lowering the thermal conductivity of the water box 25, by improving corrosion resistance, by simplifying and reducing the components, by allowing the water box 25 to be injection molded to substantially reduce its cost and by providing better electrical isolation of the components.

While the preferred embodiments described herein set forth the best mode to practice this invention presently contemplated by the inventors, numerous modifications and adaptations of this invention will be apparent to others skilled in the art. Therefore, the embodiments are to be considered as illustrative and exemplary and it is understood that the claims are intended to cover such modifications and adaptations as they are considered to be within the spirit and scope of this invention.

What is claimed is:

1. A thermoelectric air conditioner having a plastic water box and a plurality of first and second heat transfer plates separated by a plurality of semiconductor pellets, said water box comprising a first fiber reinforced plastic plate having a groove disposed in one side thereof with a plurality of openings disposed in said groove for receiving said first heat transfer plates with a plurality of said semiconductor pellets soldered thereto and a sealant disposed between said first plastic plate and first heat transfer plates adjacent the periphery of said openings, said second heat transfer plates being disposed on the side of said first plastic plate without the groove and in contact with said semiconductor pellets and a second fiber reinforced plastic plate cooperating with said first plastic plate to form a water box that electrically and thermally isolates the first and second heat transfer plates and provides a closed channel for heat rejection fluid.

2. The thermoelectric air conditioner of claim 1, wherein the second fiber reinforced plastic plate has a groove disposed in one side with a plurality of openings disposed in the groove for receiving said first heat transfer plates with a plurality of said semiconductor pellets soldered thereto and second heat transfer plates disposed on the side of said second heat transfer plate without said groove and in contact with said semiconductor pellets, said groove in said second plastic plate registering with said groove in said first plastic plate.

3. The thermoelectric air conditioner of claim 2, wherein the openings in the second fiber reinforced plastic plate register with the openings in the first fiber reinforced plastic plate.

4. The thermoelectric air conditioner of claim 2, wherein the second heat transfer plate has an extended surface.

5. The thermoelectric air conditioner of claim 2, wherein the second heat transfer Plate has fins affixed thereto.

6. The thermoelectric air conditioner of claim 1, wherein the groove is serpentine and extends over the plate.

7. The thermoelectric air conditioner of claim 1, wherein the groove is serpentine and has a plurality of parallel segments.

8. The thermoelectric air conditioner of claim 1, wherein the first and second fiber reinforced plates are interchangeable.

9. The thermoelectric air conditioner of claim 8, wherein the grooves are serpentine and extend over the plates.

10. The thermoelectric air conditioner of claim 8, wherein the grooves are serpentine and have a plurality of parallel segments.

11. The thermoelectric air conditioner of claim 8, wherein the fiber reinforced plates are made of fiber filled polyphenylene sulfide.

12. The thermoelectric air conditioner of claim 8, wherein the fiber reinforced plates are made of a fiber filled thermoplastic.

13. The thermoelectric air conditioner of claim 8, wherein the fiber reinforced plates are made of a fiber filled plastic having a coefficient of thermal expansion generally corresponding to that of aluminum.

14. The thermoelectric air conditioner of claim 8, wherein the fiber reinforced plates are made of glass filled polyphenylene sulfide.

15. The thermoelectric air conditioner of claim 8, wherein the second heat transfer plates have fins extending outwardly to a distal margin.

16. The thermoelectric air conditioner of claim 15 and further comprising a cover plate disposed adjacent the distal margins of the fins to channel the air over the fins.

17. The thermoelectric air conditioner of claim 16, wherein the first and second heat transfer plates and semiconductor are disposed to form a single series circuit, whereby two electrical leads can be brought to one corner of the water box to supply electrical energy necessary for operation.

18. The thermoelectric air conditioner of claim 8, wherein the first and second heat transfer plates and semiconductor are disposed to form a single series circuit, whereby two electrical leads can be brought to one corner of the water box to supply electrical energy necessary for operation.

19. The thermoelectric air conditioner of claim 8, wherein the first and second heat transfer plates and semiconductors associated with each fiber reinforced plate is disposed to form a series circuit.

20. The thermoelectric air conditioner of claim 8, wherein the first and second heat transfer plates and semiconductors associated with each fiber reinforced plate is disposed to form a series circuit.

* * * * *